United States Patent
Tek et al.

(10) Patent No.: US 10,641,818 B2
(45) Date of Patent: May 5, 2020

(54) SHAPE CONFORMABLE CAPACITIVE COUPLER

(71) Applicant: Keysight Technologies, Inc., Santa Rosa, CA (US)

(72) Inventors: Choon Kait Andrew Tek, Singapore (SG); Mei Siem Wong, Singapore (SG)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/113,713

(22) Filed: Aug. 27, 2018

(65) Prior Publication Data

US 2020/0064395 A1   Feb. 27, 2020

(51) Int. Cl.

| | | |
|---|---|---|
| *H05K 1/11* | (2006.01) | |
| *G01R 31/28* | (2006.01) | |
| *H05K 3/40* | (2006.01) | |
| *H05K 3/30* | (2006.01) | |
| *H05K 1/02* | (2006.01) | |
| *B33Y 80/00* | (2015.01) | |
| *B33Y 10/00* | (2015.01) | |
| *B33Y 50/02* | (2015.01) | |

(52) U.S. Cl.
CPC ....... *G01R 31/2818* (2013.01); *H05K 1/0268* (2013.01); *H05K 1/11* (2013.01); *H05K 3/303* (2013.01); *H05K 3/40* (2013.01); *B33Y 10/00* (2014.12); *B33Y 50/02* (2014.12); *B33Y 80/00* (2014.12); *H05K 2201/10325* (2013.01); *H05K 2201/10954* (2013.01)

(58) Field of Classification Search
CPC ........................................ H05K 1/11
USPC ........................................ 174/260
See application file for complete search history.

(56) References Cited

U.S. PATENT DOCUMENTS

| | | | | |
|---|---|---|---|---|
| 5,557,209 A | | 9/1996 | Crook | |
| 5,969,530 A | * | 10/1999 | Yamashita | ......... G01R 31/2805 324/523 |
| 5,975,958 A | * | 11/1999 | Weidler | ............. H01R 13/6625 439/620.22 |
| 6,437,586 B1 | * | 8/2002 | Robinson | ............. G01R 1/0433 324/756.02 |

(Continued)

OTHER PUBLICATIONS

Keysight Technologies, "Maximizing Test Coverage with Medalist VTEP v2.0—VTEP, iVTEP, and NPM," White Paper, Published in USA, Jul. 31, 2014.

*Primary Examiner* — Stanley Tso

(57) ABSTRACT

Illustrative embodiments disclosed herein pertain to a capacitive coupler that is custom fabricated to provide shape conformability with a component under test. The shape conformability allows the capacitive coupler to provide a high level of capacitive coupling between an electrode in the capacitive coupler and a metal part contained in the component. The electrode in the capacitive coupler has one or more characteristics such as a shape and an orientation, that are defined by utilizing the metal part as a template during fabrication of the capacitive coupler. In one exemplary embodiment, the electrode in the capacitive coupler has a form factor that substantially matches a form factor of the metal part contained in the component. In another exemplary embodiment, the metal part is oriented at a non-orthogonal angle with respect to a major surface of a printed circuit board upon which the component is mounted.

10 Claims, 9 Drawing Sheets

(56) References Cited

U.S. PATENT DOCUMENTS

| | | | |
|---|---|---|---|
| 9,435,855 B2 | 9/2016 | Lewinnek | |
| 9,778,314 B2 | 10/2017 | Suto | |
| 9,977,052 B2 | 5/2018 | Suto | |
| 2008/0168318 A1* | 7/2008 | DeMent | G01R 31/3004 714/745 |
| 2009/0315556 A1* | 12/2009 | Driemel | G01R 33/3415 324/307 |
| 2011/0148450 A1* | 6/2011 | Suto | G01R 31/2808 324/756.04 |
| 2011/0156739 A1* | 6/2011 | Chang | G01R 1/0433 324/756.02 |
| 2011/0204910 A1* | 8/2011 | Suto | G01R 31/2815 324/754.01 |
| 2012/0268155 A1* | 10/2012 | Rathburn | G01R 31/2889 324/756.02 |
| 2015/0185281 A1* | 7/2015 | Diglio | G01R 1/0466 324/750.24 |
| 2015/0340814 A1* | 11/2015 | Jaussi | H01R 13/6461 439/39 |
| 2016/0190918 A1* | 6/2016 | Ho | H01L 23/48 327/530 |
| 2018/0037137 A1* | 2/2018 | Goedert | B60N 2/5685 |

* cited by examiner

SHAPE CONFORMABLE CAPACITIVE COUPLER

BACKGROUND

Printed circuit board assemblies are ubiquitously employed in a wide range of products ranging from mass scale consumer products to sophisticated instruments used for specialized applications. It is highly desirable that printed circuit board assemblies, particularly ones that are used in mass scale consumer products, are manufactured in a cost-effective manner and are highly reliable to operate. Towards this end, most manufacturers of printed circuit board assemblies use automated machinery that execute various functions such as picking and placing components upon a printed circuit board, followed by soldering these components upon the printed circuit board. The completed printed circuit board assembly is then inspected for quality by various types of inspection machines that carry out the inspection in a very rapid and efficient manner. One of the inspection machines is known in the industry as a bed-of-nails tester and is used to test the integrity of various soldered connections as well as to detect certain types of failures in the components mounted upon the printed circuit board.

The types of testing performed by the bed-of-nails tester may include various functional tests to evaluate various circuit functions of the printed circuit board assembly. In one exemplary functional test, a voltage gain of an amplifier circuit may be evaluated by applying power to the amplifier circuit and measuring an output signal that is generated by the amplifier circuit in response to a test signal coupled into the amplifier circuit. In some cases, such a functional test may fail to evaluate circuits other than the amplifier circuit on the printed circuit board assembly and may also fail to verify connectivity between various nodes on the printed circuit board assembly that are not associated with the amplifier circuit.

Consequently, functional tests are often complemented, or supplemented, by continuity tests that are used to check for abnormal connections such as short circuits and/or open circuits. A short circuit condition can occur for example, when an excessive amount of solder causes a solder bridge to be formed between two solder pads on the printed circuit board assembly. Abnormal open circuit conditions can occur for example, when no solder is applied to a solder pad, or when an inadequate amount of heat is applied for melting the solder on to the solder pad.

The continuity tests can be carried out in various ways such as by propagating a DC current from a solder pad located on a bottom surface of a printed circuit board assembly and through a lead of a device that is mounted upon a top surface of the printed circuit board assembly to verify the solder connection. The continuity test works effectively for evaluating such a connection. However, there may be several elements on the top surface of the printed circuit board assembled that may be inaccessible for purposes of propagating a DC current. One example of such an inaccessible element is a solder joint located below a ball-grid array package mounted upon a printed circuit board.

The connections associated with the ball-grid array package are therefore tested by placing a test electrode on a top surface of the ball-grid array package for receiving an AC signal that is propagated from a solder pad on the printed circuit board assembly and through the body of the ball-grid array package. Such a test configuration may prove satisfactory when the capacitive coupling provided through the body of the ball-grid array package is adequate for propagating the AC signal. However, this is not always the case because of various factors such as for example, a large and unavoidable separation distance between the test electrode and a pin of the ball-grid array package through which the AC signal is propagated into the ball-grid array package by the bed-of-nails tester.

SUMMARY

According to one exemplary embodiment of the disclosure, a method includes utilizing a metal part contained in a component as a template to define at least a curved portion of a first electrode of a capacitive coupler. The method further includes: providing at least one computer and transmitting a set of commands from the at least one computer to at least one 3D printer. The set of commands configure the at least one 3D printer to execute operations that include: utilizing a dielectric material to fabricate a first part of the capacitive coupler and utilizing an electrically conductive material to fabricate a second part of the capacitive coupler. The second part comprises the curved portion of the first electrode covered, at least partially, by the dielectric material of the first part.

According to another exemplary embodiment of the disclosure, a method includes providing a component that is mounted upon a major surface of one of a platform or a printed circuit board, the component comprising a first metal part that is oriented at a non-orthogonal angle with respect to the major surface of the one of the platform or the printed circuit board. The method further includes: providing a capacitive coupler comprising a first electrode that is oriented substantially parallel to the first metal part and engaging the capacitive coupler with the component located on the major surface of the one of the platform or the printed circuit board in part by arranging the first electrode and the first metal part to provide capacitive coupling.

According to yet another exemplary embodiment of the disclosure, a capacitive coupler includes a first part comprising a dielectric material and a second part comprising an electrode having a first curved portion that is covered at least partially, by the dielectric material of the first part. The first curved portion is arranged to provide capacitive coupling with a second curved portion of a metal part that is contained in a component mounted upon a major surface of one of a platform or a printed circuit board.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Figure 1:
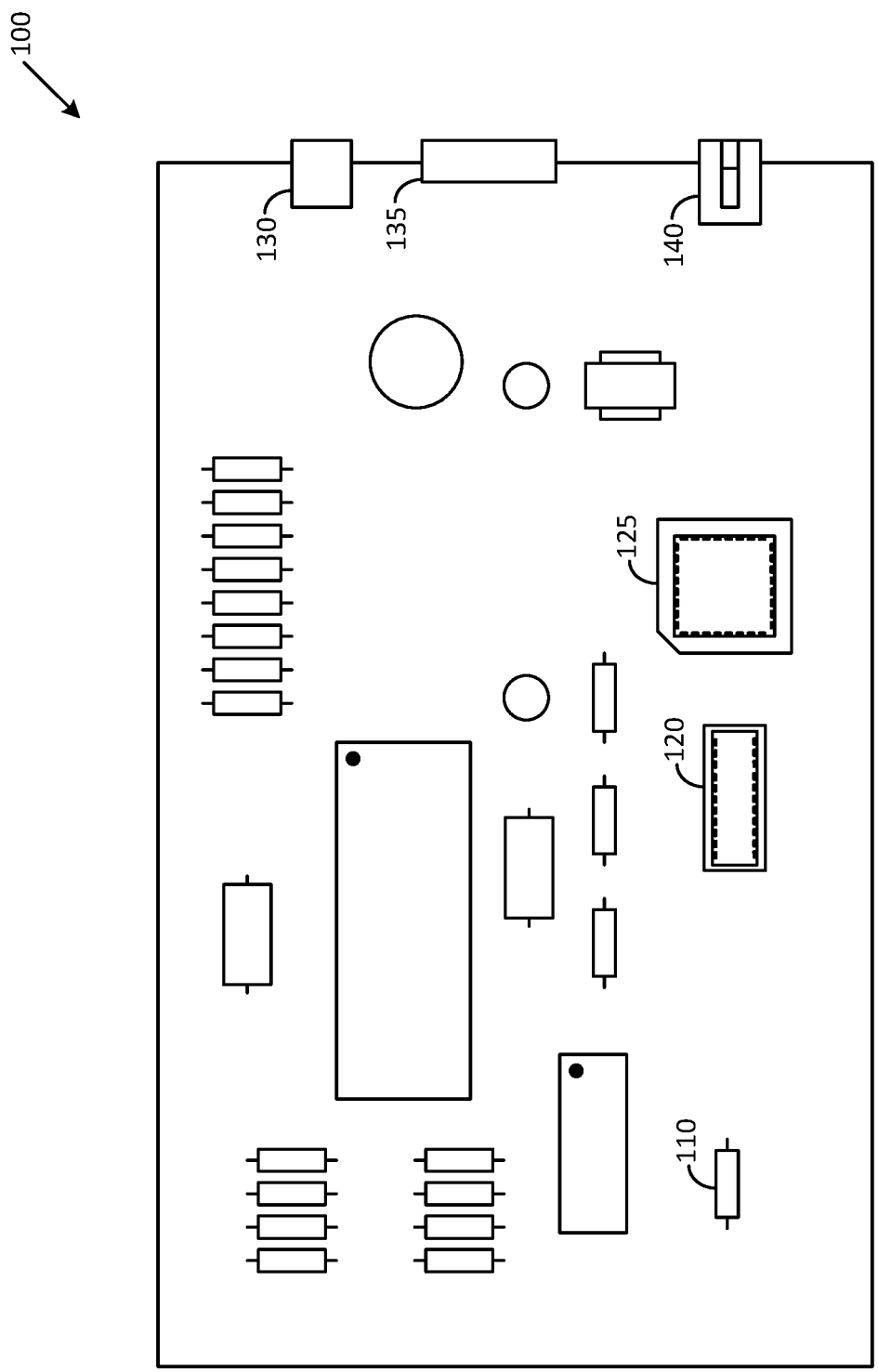
FIG. 1 shows a top view of an exemplary printed circuit board assembly having various components that can be tested by using a capacitive coupler in accordance with an exemplary embodiment of the disclosure.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, various words such as "top" and "bottom," which are used herein to indicate relative orientations and/or relative locations, should not necessarily be interpreted as absolute orientations and locations. For example, a "bottom" end of an object that is shown in an upright position in an exemplary illustration of the object, can be located on a side of the object when the object is placed in a horizontal position. As another example, the word "cavity" that is used herein can be interpreted in various other ways such as a "notch" or an "indentation." As yet another example, the word "pin" as used herein is interchangeable with various other words such as "terminal," "contact," or "lead." The words "substantial" or "substantially" as used herein are indicative of practical tolerances that come into play when applying certain procedures such as when matching the shape of one object to another or when fabricating one object that is identical to another. For example, practical tolerances may dictate that the curvature of one object may be slightly different than the curvature of another object (by a few millimeters, for example) when the shapes of these two objects are "substantially matched" or "substantially similar." Such tolerances can be understood by persons of ordinary skill in the art. Furthermore, the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

In terms of a general overview, the various illustrative devices and methods disclosed herein pertain to a capacitive coupler that is custom fabricated to provide shape conformability with a component under test. The shape conformability allows the capacitive coupler to provide a high level of capacitive coupling between an electrode in the capacitive coupler and a metal part contained in the component. The electrode in the capacitive coupler has one or more characteristics (such as a shape and an orientation), that are defined by utilizing the metal part as a template during fabrication of the capacitive coupler. In one exemplary embodiment, the electrode in the capacitive coupler has a form factor that substantially matches a form factor of the metal part contained in the component. In another exemplary embodiment, the metal part is oriented at a non-orthogonal angle with respect to a major surface of a platform or a printed circuit board upon which the component is mounted. One among various types of tests that can be carried out by using a capacitive coupler in accordance with the disclosure, is a continuity test for evaluating a soldered connection between one or more leads of the component and the printed circuit board upon which the component is mounted.

FIG. 1 shows a top view of an exemplary printed circuit board assembly 100 having various components that can be tested by using a capacitive coupler (not shown) in accordance with an exemplary embodiment of the disclosure. As is typical of such assemblies, the printed circuit board assembly 100 can include various components such as integrated circuits, resistors, capacitors, transformers, sockets, and connectors. In this example, the various components include a resistor 110, a dual in-line package (DIP) socket 120, a plastic leaded chip carrier (PLCC) socket 125, an RJ-45 connector 140, a universal serial bus (USB) connector 130, and a high-definition multimedia interface (HDMI) connector 135. During manufacture, the various components are mounted upon the printed circuit board assembly 100 by a pick-and-place machine for example, and the printed circuit board assembly 100 is subjected to an automated soldering procedure for soldering the leads of the components to the printed circuit board. In some cases, the automated soldering procedure may lead to a few defects such as an open circuit condition or a short circuit condition. Such defects can be identified by using test equipment such as a bed-of-nails tester for performing various tests such as a continuity test for checking the integrity of the soldered connections and a functionality test for testing functionality of circuitry located upon the printed circuit board.

Figure 2:
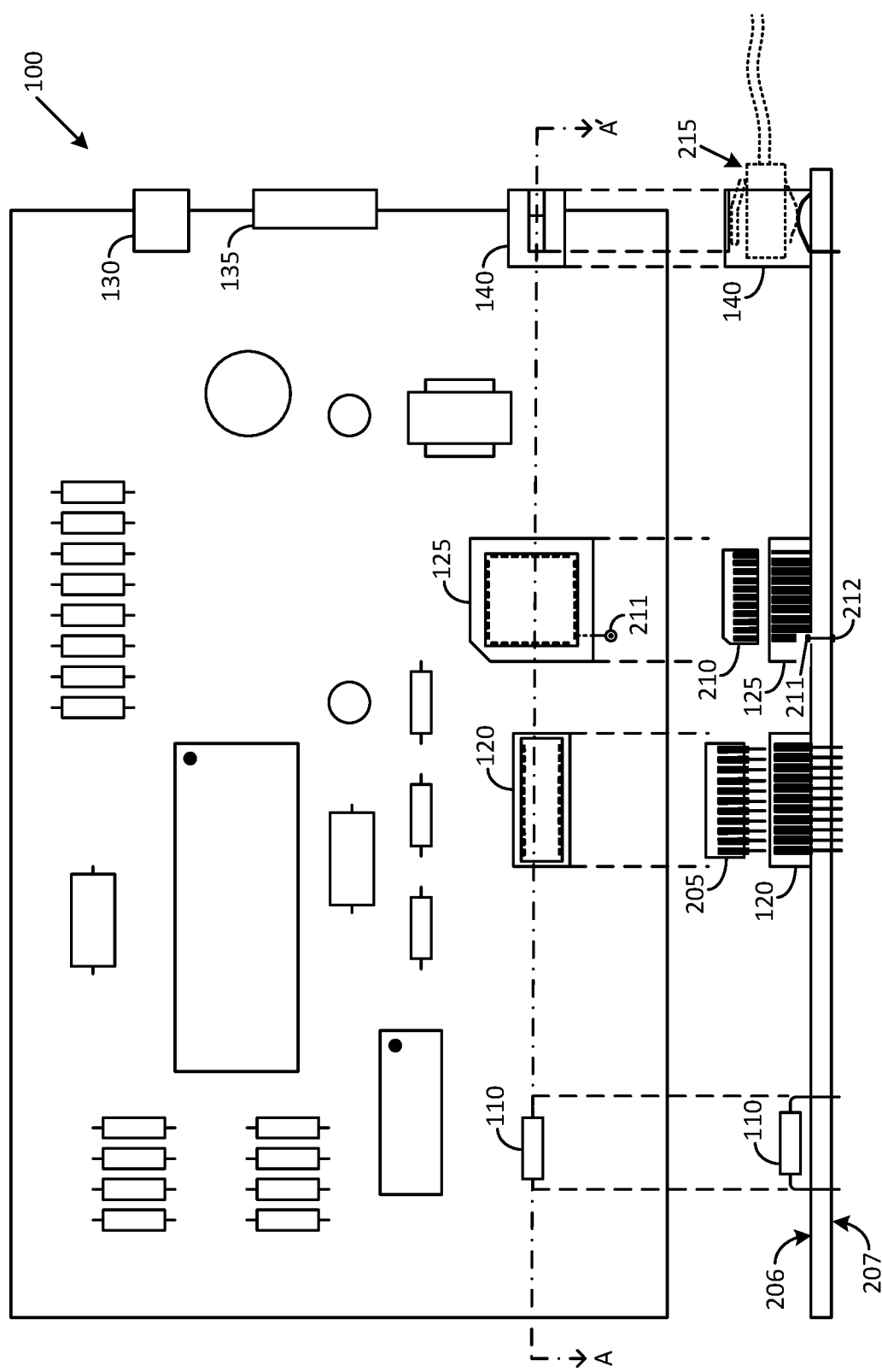
FIG. 2 includes a cross-sectional view of a portion of the printed circuit board assembly shown in FIG. 1.

FIG. 2 includes a cross-sectional view along an axis A-A' of the printed circuit board assembly 100. As shown in the cross-sectional view, the resistor 110 is a leaded resistor mounted on a top major surface 206 of the printed circuit board assembly 100. The two leads of the resistor 110 pass through a pair of vias (not shown) and are soldered to a pair of solder pads (not shown) on a bottom major surface 207 of the printed circuit board assembly 100. The two leads of the resistor 110 are accessible on the top side of the printed circuit board assembly 100 and the solder pads are accessible on the bottom side of the printed circuit board assembly 100. A continuity testing instrument such as a multimeter or an automated bed-of-nails tester can apply probes to each lead of the resistor 110 and to each solder pad for carrying out a continuity test to ensure that the resistor 110 has been soldered satisfactorily on to the printed circuit board assembly 100.

The DIP socket 120, which is used for housing a DIP integrated circuit (DIP IC) 205, has multiple leads that pass through a number of vias (not shown) and are soldered to solder pads (not shown) on the bottom major surface 207 of the printed circuit board assembly 100. The leads of the DIP socket 120 are accessible on the top side of the printed circuit board assembly 100 and the solder pads are accessible on the bottom side of the printed circuit board assembly 100. A continuity testing instrument such as a multimeter or an automated bed-of-nails tester can apply probes to each lead of the DIP socket 120 on the top side of the printed circuit board assembly 100 and to each solder pad on the bottom side of the printed circuit board assembly 100 for carrying out a continuity test to ensure that each lead of the DIP socket 120 has been soldered satisfactorily on to the printed circuit board assembly 100.

The PLCC socket 125 is used for housing a PLCC chip 210. Unlike the DIP socket 120, which has leads extending from the top major surface 206 to the bottom major surface 207 of the printed circuit board assembly 100, the PLCC socket 125 is a surface mount component that is soldered on to solder pads located on the top major surface 206 of the printed circuit board assembly 100. Consequently, a continuity testing instrument such as a multimeter or an automated bed-of-nails tester cannot directly access the leads of the PLCC socket 125 from the bottom major surface 207 of the printed circuit board assembly 100. One solution that addresses this lack of access involves providing test pads specifically for purposes of testing the printed circuit board assembly 100. An exemplary test pad 211 is shown connected to a lead in the PLCC socket 125. Additional test pads may be provided if some or all of the remaining leads of the PLCC socket 125 are to be tested. The test pad 211 that is located on the top major surface 206 of the printed circuit board assembly 100 is connected by a through-hole plated via to a solder pad 212 located on the bottom major surface 207 of the printed circuit board assembly 100. A continuity testing instrument such as a multimeter or an automated bed-of-nails tester can access the lead in the PLCC socket 125 by applying a probe to the solder pad 212 on the bottom major surface 207 of the printed circuit board assembly 100 for carrying out a continuity test to ensure that the lead of the PLCC socket 125 has been soldered satisfactorily on to the printed circuit board assembly 100.

The RJ-45 connector 140 is used for connecting a communication cable having a corresponding RJ-45 plug 215 to the printed circuit board assembly 100. The RJ-45 connector 140, which is a through-hole connector in this example, includes a set of contacts enclosed inside a connector body and includes corresponding leads that extend from the top major surface 206 to the bottom major surface 207 of the printed circuit board assembly 100. A continuity testing instrument such as a multimeter or an automated bed-of-nails tester can access the leads on the bottom major surface 207 of the printed circuit board assembly 100 for carrying out a continuity test to ensure that the lead of the RJ-45 connector 140 has been soldered satisfactorily on to the printed circuit board assembly 100.

When implemented in through-hole form, the leads of the USB connector 130 and the HDMI connector 135 can be accessed from the bottom major surface 207 of the printed circuit board assembly 100 as well. When implemented in surface mount form, the leads of the RJ-45 connector 140, the USB connector 130, and/or the HDMI connector 135 are inaccessible from the bottom major surface 207 of the printed circuit board assembly 100. Test pads such as the test pad 211 described above can be used in such cases.

Figure 3:
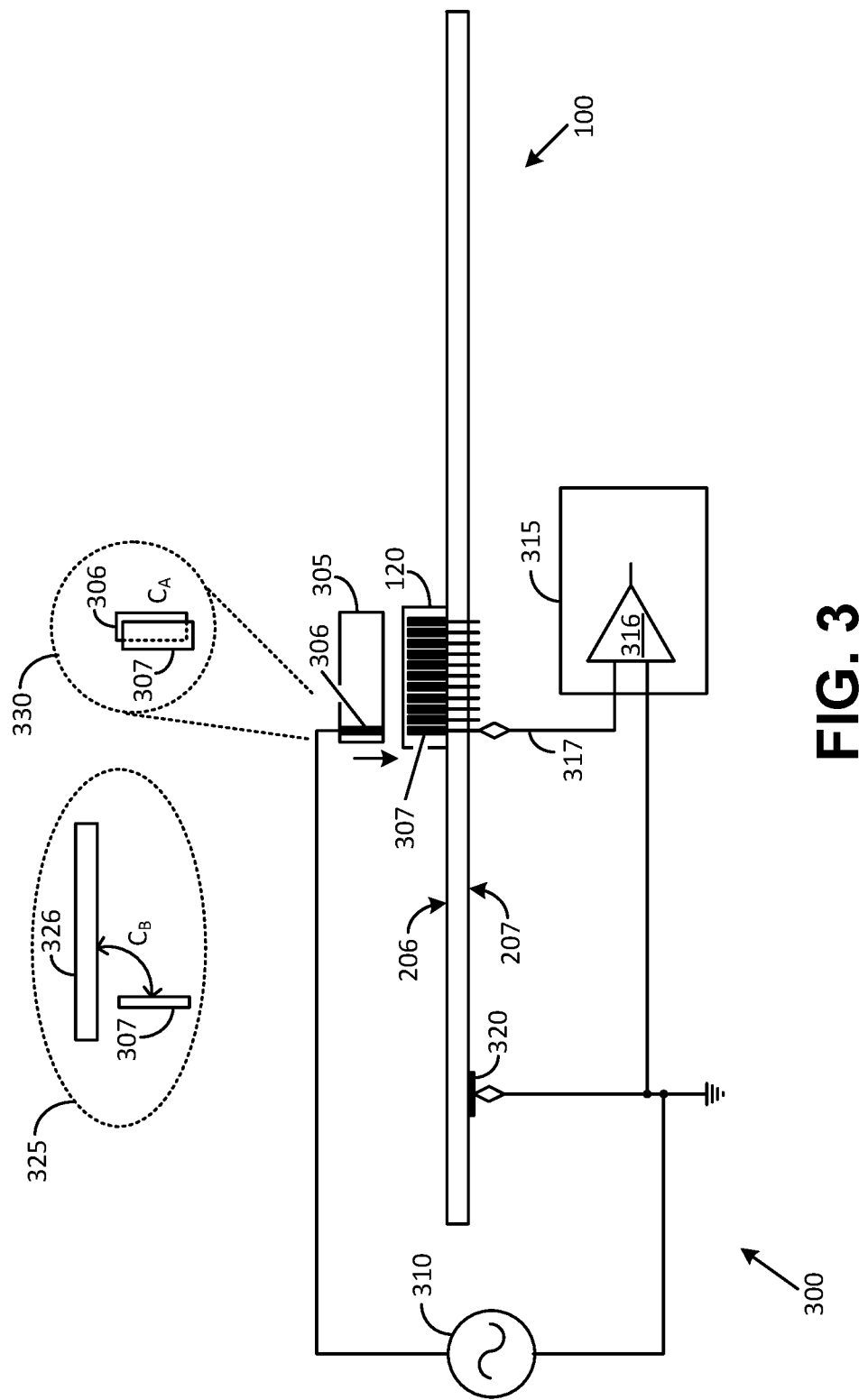
FIG. 3 illustrates a test system that includes a first exemplary capacitive coupler in accordance with an exemplary embodiment of the disclosure.

FIG. 3 illustrates a test system 300 that includes a first exemplary capacitive coupler 305 in accordance with an embodiment of the disclosure. The test system 300 can include various types of capacitive couplers adapted for testing various components mounted on the printed circuit board assembly 100. In this example setup, test system 300 is used for testing the DIP socket 120 and includes the capacitive coupler 305 connected to an AC signal source 310 and a measuring system 315. The AC signal source 310 is connected between an electrode 306 that is a part of the capacitive coupler 305, and an exemplary ground node 320 on the printed circuit board assembly 100. In an alternative implementation, the AC signal source 310 and the measuring system 315 trade places. Accordingly, the AC signal source 310 is arranged to provide an input signal to the pin 307 in the DIP socket 120 and the measuring system 315 is coupled to the capacitive coupler 305.

The capacitive coupler 305 has a form factor that substantially matches the form factor of the DIP IC 205 that is pluggable into the DIP socket 120 (as illustrated in FIG. 2). Consequently, the capacitive coupler 305 can be inserted into the DIP socket 120 without applying special alignment procedures or techniques to ensure that various electrodes of the capacitive coupler 305 are aligned with corresponding pins of the DIP socket 120. In the example implementation shown in FIG. 3, the capacitive coupler 305 has a single electrode 306 that is aligned with a pin 307 in the DIP socket 120. In other implementations for testing the DIP socket 120, the capacitive coupler 305 can include multiple electrodes each of which is automatically aligned with a corresponding pin in an interior portion of the DIP socket 120 when the capacitive coupler 305 is inserted into the DIP socket 120.

A dielectric layer may be provided on top of the electrode 306 whereby the electrode 306 and the dielectric layer operate in conjunction with the pin 307 in the DIP socket 120 to provide capacitive coupling. The pin 307 is operative as a second electrode in this capacitive coupling arrangement. The dielectric layer not only helps in ensuring the capacitive coupler 305 fits snugly into the DIP socket 120 but also provides a higher dielectric constant to the capacitive coupling between the electrode 306 and the pin 307 in comparison to an air gap between the electrode 306 and the pin 307.

The measuring system 315 can include various elements such as an amplifier 316, an analog-to-digital converter (ADC) coupled to an output of the amplifier 316, and a processor that processes the digital data output of the ADC for determining an amplitude of an AC signal received by the measuring system 315. The amplifier 316, which is configured as a single-input amplifier in this exemplary implementation, has one input terminal connected to a probe 317 that is placed in contact with the pin 307 of the DIP socket 120, and another input terminal connected to the ground node 320. The probe 317 can be a nail in a bed-of-nails tester. In another exemplary embodiment, the amplifier 316 is configured as a differential input amplifier and the connections in the test system 300 are arranged accordingly.

When the test system 300 is in operation, the AC signal source 310 provides an AC signal that is capacitively coupled via the electrode 306 in the capacitive coupler 305 and the pin 307 in the DIP socket 120, into the probe 317. The measuring system 315 measures an amplitude of the AC signal received via the probe 317. If a soldering defect is present in the soldered connection between the pin 307 and the printed circuit board assembly 100, the amplitude of the AC signal measured by the measuring system 315 can be zero, which is indicative of an open circuit, or can be lower than a threshold value, which is indicative of a poor solder joint. On the other hand, if the soldered connection between the pin 307 and the printed circuit board assembly 100 is satisfactory, the amplitude of the AC signal measured by the measuring system 315 will be equal to the amplitude of the AC signal generated by the AC signal source 310 minus voltage drops in the signal propagation path between the AC signal source 310 and the measuring system 315. These voltage drops include a voltage drop in the capacitive coupler 305. It is desirable that the voltage drop in the capacitive coupler 305 be as low as possible so as to enable the measuring system 315 to operate with a higher level of sensitivity for detecting various kinds of subtle defects in the printed circuit board assembly 100.

The electrode 306 is in close proximity to, and in parallel with, the pin 307 in the DIP socket 120 because the capacitive coupler 305 has a form factor that substantially matches the form factor of the DIP IC 205. The parallel arrangement, which is illustrated in the diagram shown inside the dotted line section 330, provides a higher level of capacitive coupling (CA), which translates to a low voltage drop. The diagram shown inside the dotted line section 325 corresponds to an exemplary capacitive coupling arrangement wherein a sensor plate 326 is laid flat upon a top surface of the DIP socket 120. Such an orientation and structure provide a lower level of capacitive coupling (CB) between the sensor plate 326 and the pin 307 in the DIP socket 120, which translates to a higher voltage drop and correspondingly lower sensitivity in the measuring system 315.

Figure 4:
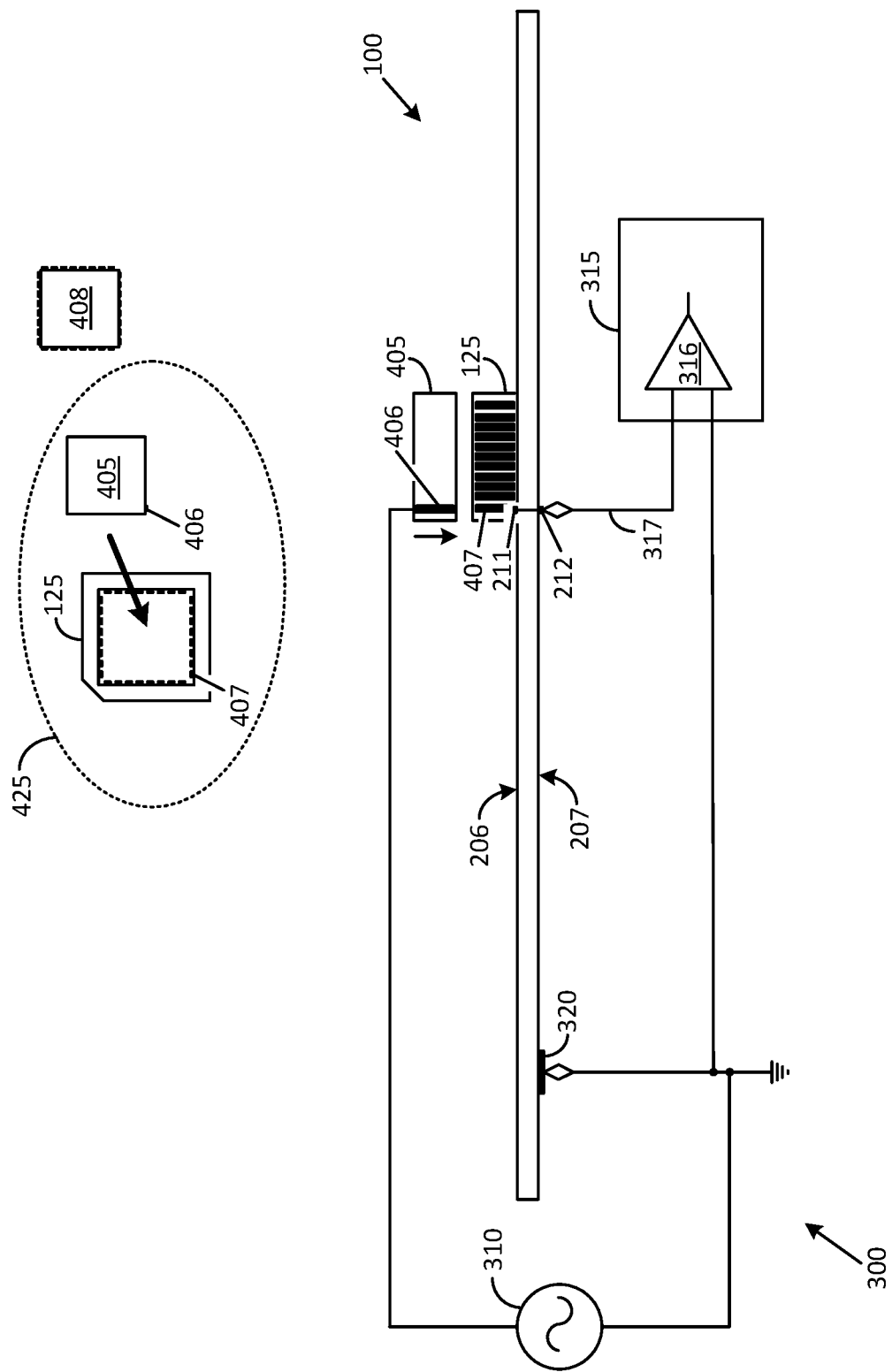
FIG. 4 illustrates a test system that includes a second exemplary capacitive coupler in accordance with an exemplary embodiment of the disclosure.

FIG. 4 illustrates the test system 300 that includes a second exemplary capacitive coupler 405 in accordance with an exemplary embodiment of the disclosure. In this example setup, the capacitive coupler 405 is used for testing the PLCC socket 125 and has a form factor that substantially matches the form factor of the PLCC chip 210 that is pluggable into the PLCC socket 125 (as illustrated in FIG. 2). Consequently, the capacitive coupler 405 can be inserted into the PLCC socket 125 without applying special alignment procedures or techniques to ensure that various electrodes of the capacitive coupler 405 are aligned with corresponding pins of the PLCC socket 125. In this example embodiment, the capacitive coupler 405 has a single electrode 406 that is aligned with a pin 407 in the PLCC socket 125. This arrangement is illustrated in the diagram shown inside the dotted line section 425. In other implementations for testing the PLCC socket 125, the capacitive coupler 405 can include multiple electrodes (as illustrated by the exemplary capacitive coupler 408), each of which is aligned with a corresponding pin in an interior portion of the PLCC socket 125 when the capacitive coupler 405 is inserted into the PLCC socket 125.

A dielectric layer may be provided on top of the electrode 406 whereby the electrode 406 and the dielectric layer operate in conjunction with the pin 407 in the PLCC socket 125 to provide capacitive coupling. The pin 407 is operative as a second electrode in this capacitive coupling arrangement. The dielectric layer not only helps in ensuring the capacitive coupler 405 fits snugly into the PLCC socket 125 but also provides a higher dielectric constant to the capacitive coupling between the electrode 406 and the pin 407 in comparison to an air gap between the electrode 406 and the pin 407.

In this exemplary implementation, the AC signal source 310 is coupled between the electrode 406 that is a part of the capacitive coupler 405, and the ground node 320 on the printed circuit board assembly 100. In an alternative implementation, the AC signal source 310 and the measuring system 315 trade places. The amplifier 316, which is configured as a single-input amplifier has one input terminal connected to a probe 317 that is placed in contact with the solder pad 212 on the bottom major surface 207 of the printed circuit board assembly 100. The operation of the test system 300 for testing the PLCC socket 125 is similar to that employed by the test system 300 when testing the DIP socket 120 and will not be repeated here.

The electrode 406 is in close proximity to, and in parallel with, the pin 407 in the PLCC socket 125 because the capacitive coupler 405 has a form factor that substantially matches the form factor of the PLCC socket 125. The parallel arrangement provides a higher level of capacitive coupling than a capacitive coupling arrangement wherein a sensor plate is laid flat upon a top surface of the PLCC socket 125.

Figure 5:
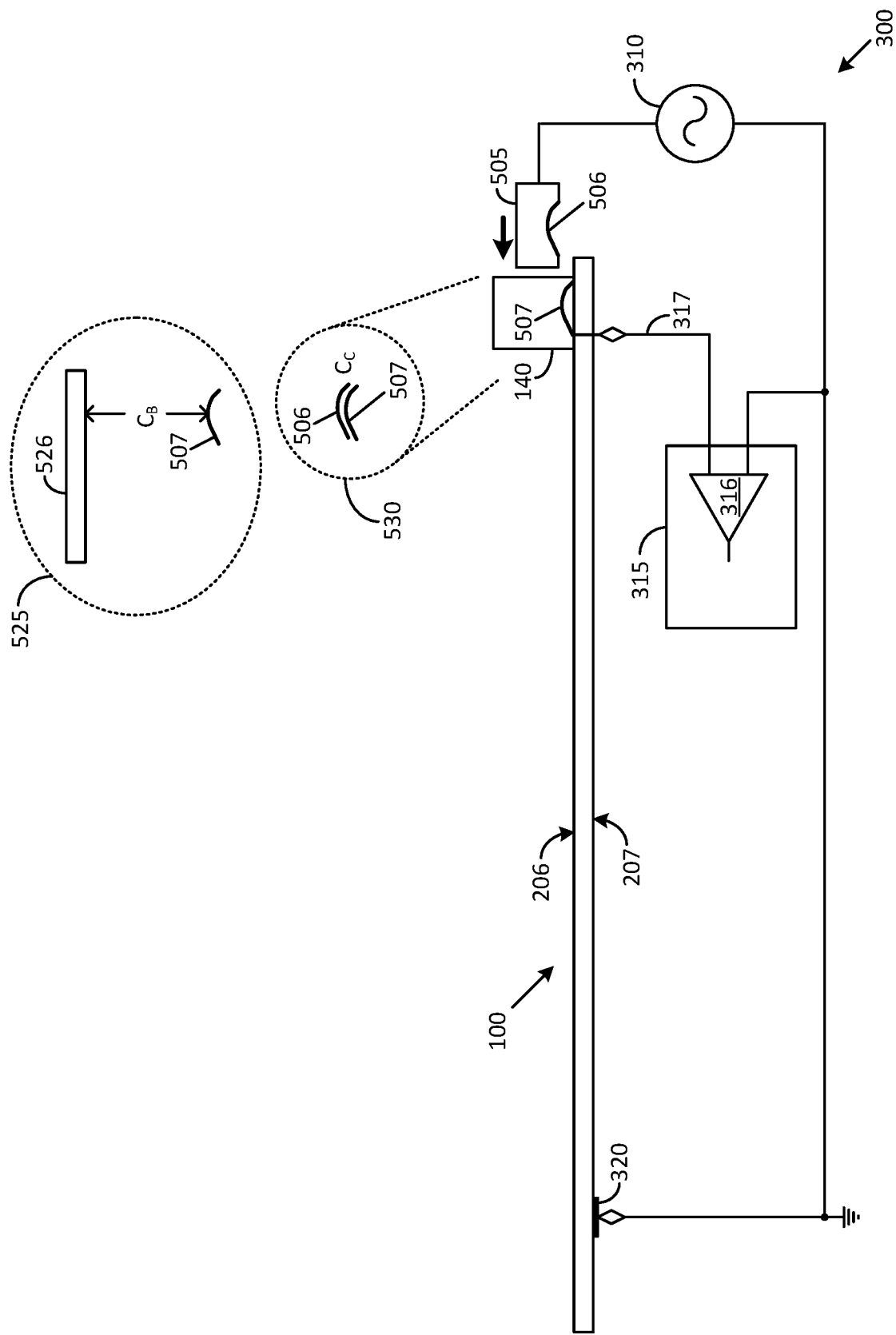
FIG. 5 illustrates a test system that includes a third exemplary capacitive coupler in accordance with an exemplary embodiment of the disclosure.

FIG. 5 illustrates the test system 300 that includes a third exemplary capacitive coupler 505 in accordance with an embodiment of the disclosure. In this example setup, the capacitive coupler 505 is used for testing the RJ-45 connector 140 and has a form factor that substantially matches a form factor of the RJ-45 plug 215 shown in FIG. 2. Consequently, the capacitive coupler 505 can be inserted into the RJ-45 connector 140 without applying special alignment procedures or techniques to ensure that various electrodes of the capacitive coupler 505 are aligned with corresponding pins of the RJ-45 connector 140.

In this exemplary embodiment, the capacitive coupler 505 has a single electrode 506 that is aligned with a contact 507 in the RJ-45 connector 140 when the capacitive coupler 505 is inserted into the RJ-45 connector 140. In other embodiments, the capacitive coupler 505 can include multiple electrodes each of which is aligned with a corresponding pin in the RJ-45 connector 140 when the capacitive coupler 505 is inserted into the RJ-45 connector 140. A dielectric layer may be provided on top of the electrode 506 whereby the electrode 506 and the dielectric layer operate in conjunction with the contact 507 in the RJ-45 connector 140 to provide capacitive coupling. The contact 507 is operative as a second electrode in this capacitive coupling arrangement. The dielectric layer not only helps in ensuring the capacitive coupler 505 fits snugly into the RJ-45 connector 140 but also provides a higher dielectric constant to the capacitive coupling between the electrode 506 and the contact 507 in comparison to an air gap between the electrode 506 and the contact 507.

In this exemplary implementation, the AC signal source 310 is coupled between the electrode 506 that is a part of the capacitive coupler 505, and the ground node 320 on the printed circuit board assembly 100. In an alternative implementation, the AC signal source 310 and the measuring system 315 trade places. The amplifier 316, which is configured as a single-input amplifier has one input terminal connected to a probe 317 that is placed in contact with an end of the contact 507 that extends out on the bottom major surface 207 of the printed circuit board assembly 100. The operation of the test system 300 for testing the PLCC socket 125 is similar to that employed by the test system 300 when testing the DIP socket 120 and will not be repeated here.

The electrode 506 is in close proximity to, and in parallel with, the contact 507 in the RJ-45 connector 140 because the capacitive coupler 505 has a form factor that substantially matches the form factor of the RJ-45 plug 215 that is pluggable into the RJ-45 connector 140. This capacitive coupling arrangement provides a higher level of capacitive coupling than a capacitive coupling arrangement wherein a sensor plate 526 is laid flat upon a top surface of the RJ-45 connector 140 or upright against a side wall of the RJ-45 connector 140. The capacitive relationships are illustrated in the diagrams shown inside the dotted line section 530 and the dotted line section 525 respectively.

Figure 6:
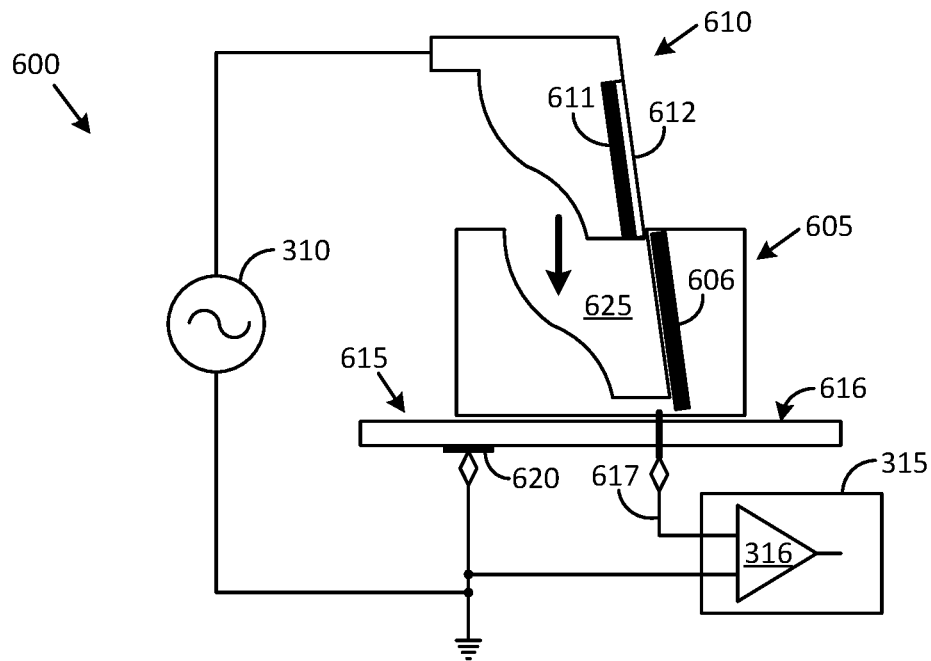
FIG. 6 illustrates a test system that includes a fourth exemplary capacitive coupler in accordance with an exemplary embodiment of the disclosure.

FIG. 6 illustrates a test system 600 that includes a fourth exemplary capacitive coupler 610 in accordance with an embodiment of the disclosure. In this example setup, the capacitive coupler 610 is used for testing a component 605 that is mounted upon a top major surface 616 of a platform 615 such as a printed circuit board. The component 605 has a metal part 606 that is oriented at a non-orthogonal angle (an angle other than 90 degrees) with respect to the top major surface 616 of the platform 615. The component 605 also includes a cavity 625 having a first wall that is substantially flat and an opposing second wall that has a curved shape.

A body portion of the capacitive coupler 610 that houses the electrode 611 has a form factor that substantially matches the form factor of the cavity 625. Consequently, the capacitive coupler 610 can be inserted into the cavity 625 without applying special alignment procedures or techniques to ensure that the electrode 611 is aligned with the metal part 606. In other implementations for testing the component 605, the capacitive coupler 610 can include multiple electrodes each of which is aligned with a corresponding metal part in the component 605 when the capacitive coupler 610 is inserted into the cavity 625 of the component 605. A dielectric layer 612 may be provided on top of the electrode 611 whereby the electrode 611 and the dielectric layer 612 operate in conjunction with the metal part 606 in the component 605 to provide capacitive coupling. The metal part 606 is operative as a second electrode in this capacitive coupling arrangement. The dielectric layer not only helps in ensuring the capacitive coupler 610 fits snugly into the cavity 625 but also provides a higher dielectric constant to the capacitive coupling between the electrode 611 and the metal part 606 in comparison to an air gap between the electrode 611 and the metal part 606. In some exemplary implementations, a material that is an electrical insulator is used in place of the dielectric material.

The AC signal source 310 is coupled between the ground node 620 on the platform 615 and the electrode 611 that is a part of the capacitive coupler 610. The amplifier 316, which is configured as a single-input amplifier has one input terminal connected to a probe 617 that is placed in contact with a terminal extending out of the bottom major surface of the platform 615. The terminal is connected to the metal part 606 in the component 605. The operation of the test system 600 for testing the component 605 is similar to that employed by the test system 300 when testing the DIP socket 120 and will not be repeated here.

Figure 7:
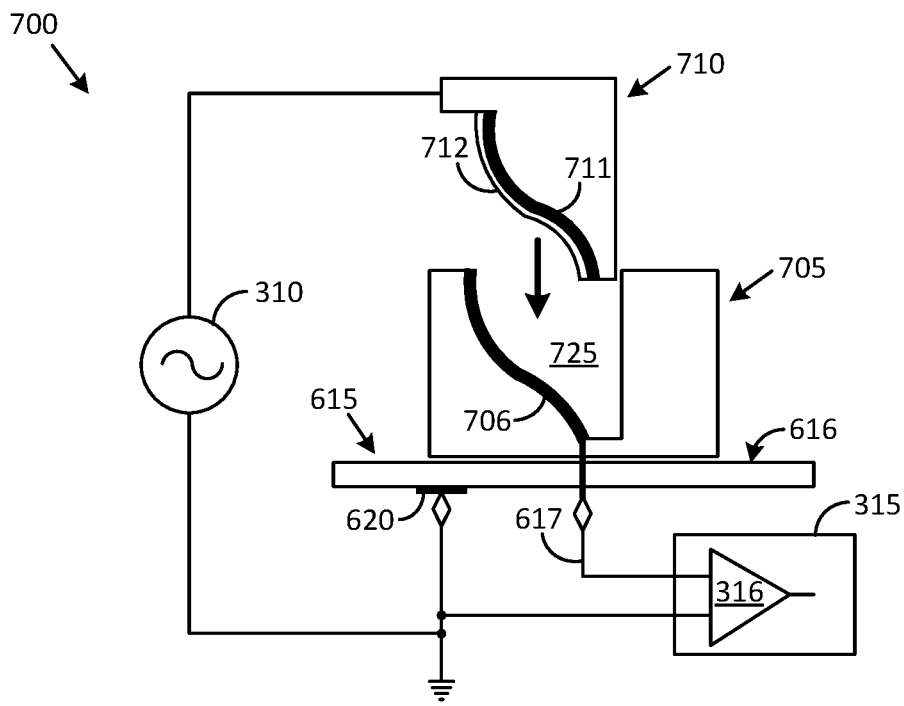
FIG. 7 illustrates a test system that includes a fifth exemplary capacitive coupler in accordance with an exemplary embodiment of the disclosure.

FIG. 7 illustrates a test system 700 that includes a fifth exemplary capacitive coupler 710 in accordance with an embodiment of the disclosure. In this example setup, the capacitive coupler 710 is used for testing a component 705 that is mounted upon the top major surface 616 of the platform 615. The component 705 has a metal part 706 that has a curved profile. In the example shown, the metal part 706 has a curved portion in the shape of an "s." The electrode 711 in the capacitive coupler 710 has a curved portion that is substantially similar in shape to the curved portion in the metal part 706. In other exemplary embodiments, the metal part 706 can include a combination of linear and non-linear shapes such as a flat portion and a curved portion.

The curved portion of the metal part 706 faces a cavity 725 in the component 705. The cavity 725 can have various shapes and can include walls that are substantially flat and/or walls that have non-linear shapes. In this exemplary embodiment, a wall of the cavity 725 that is opposite to the wall having the metal part 706 is a planar vertical wall.

A body portion of the capacitive coupler 710 that houses the electrode 711 has a form factor that substantially matches the form factor of the cavity 725. Consequently, the capacitive coupler 710 can be inserted into the cavity 725 without applying special alignment procedures or techniques to ensure that the electrode 711 of the capacitive coupler 710 is aligned with the metal part 706 in the component 705. In other implementations for testing the component 705, the capacitive coupler 710 can include multiple electrodes each of which is aligned with a corresponding metal part in the component 705 when the capacitive coupler 710 is inserted into the cavity 725 of the component 705. A dielectric layer 712 may be provided on top of the electrode 711 whereby the electrode 711 and the dielectric layer 712 operate in conjunction with the metal part 706 in the component 705 to provide capacitive coupling. The metal part 706 is operative as a second electrode in this capacitive coupling arrangement. The dielectric layer not only helps in ensuring the capacitive coupler 710 fits snugly into the cavity 725 but also provides a higher dielectric constant to the capacitive coupling between the electrode 711 and the metal part 706 in comparison to an air gap between the electrode 711 and the metal part 706. In some exemplary implementations, a material that is an electrical insulator is used in place of the dielectric material.

The AC signal source 310 is coupled between the ground node 620 on the platform 615 and the electrode 711 that is a part of the capacitive coupler 710. The amplifier 316, which is configured as a single-input amplifier has one input terminal connected to the probe 617 that is placed in contact with a terminal extending out of the bottom major surface of the platform 615. The terminal is connected to the metal part 706 in the component 705. The operation of the test system 700 for testing the component 705 is similar to that employed by the test system 300 when testing the DIP socket 120 and will not be repeated here.

Figure 8:
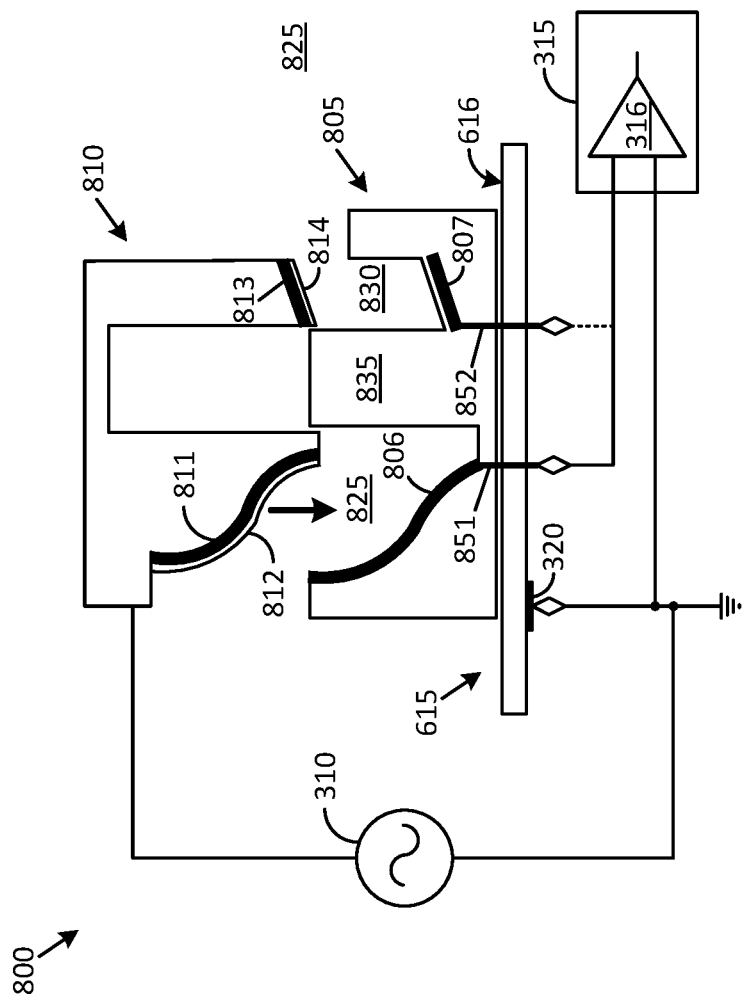
FIG. 8 illustrates a test system that includes a sixth exemplary capacitive coupler in accordance with an exemplary embodiment of the disclosure.

FIG. 8 illustrates a test system 800 that includes a sixth exemplary capacitive coupler 810 in accordance with an embodiment of the disclosure. In this example setup, the capacitive coupler 810 is used for testing a component 805 that is mounted upon the top major surface 616 of the platform 615. The component 805 has a first metal part 806 that has a non-linear profile and a second metal part 807 having a planar profile. The first metal part 806 faces a first cavity 825 in the component 705 and the second metal part 807 faces a second cavity 830 in the component 705. A vertically projecting portion 835 is present between the first cavity 825 and the second cavity 830.

At least a portion of the capacitive coupler 810 has a form factor that substantially matches the form factor of a portion of the component 805 that includes the first cavity 825, the vertically projecting portion 835, and the second cavity 830. Consequently, the capacitive coupler 810 can be engaged with the component 805 in a capacitive coupling configuration that ensures that a first electrode 811 of the capacitive coupler 810 is automatically aligned with the first metal part 806 of the component 805 and the second electrode 813 of the capacitive coupler 810 is automatically aligned with the second metal part 807 of the component 805. The second electrode 813 is located in a finger portion of the capacitive coupler 810. The finger portion is inserted into the second cavity 830 of the component 805.

A first dielectric layer 812 may be provided on top of the first electrode 811 and a second dielectric layer 814 may be provided on top of the second electrode 813 to provide a dielectric-based capacitive coupling rather than an air-based capacitive coupling. In some exemplary implementations, a material that is an electrical insulator is used in place of the dielectric material.

In an exemplary test procedure, the AC signal source 310 is first coupled between the ground node 320 on the platform 615 and the first electrode 811 for testing connectivity of the terminal 851 to the platform 615. The AC signal source is then disconnected from the first electrode 811 and connected to the second electrode 813 for testing connectivity of the terminal 852 to the platform 615.

Figure 9:
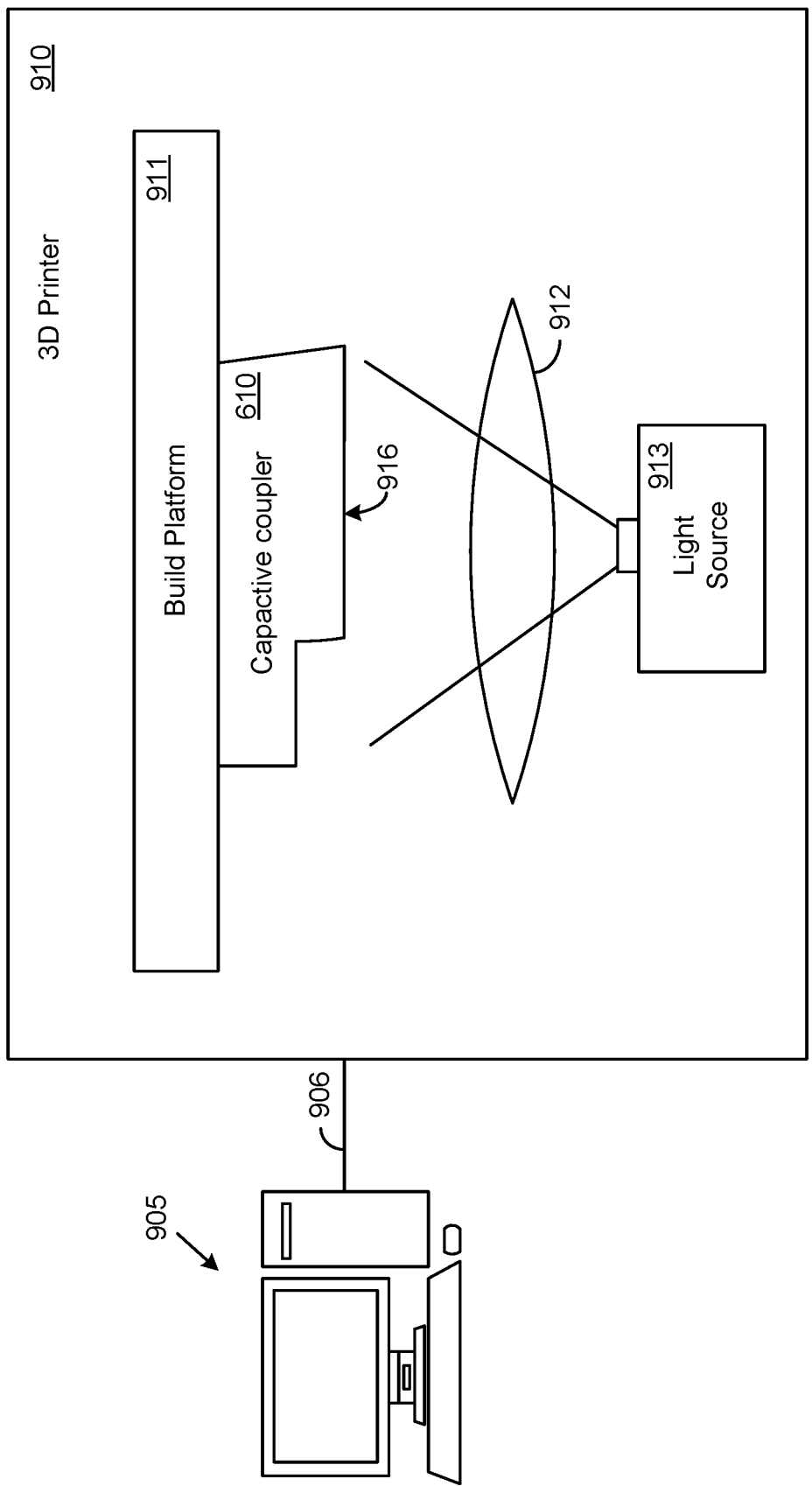
FIG. 9 shows a block representation of an exemplary 3D printer for fabricating a capacitive coupler in accordance with an exemplary embodiment of the disclosure.

FIG. 9 shows a block representation of an exemplary 3D printer 910 for fabricating a capacitive coupler in accordance with an embodiment of the disclosure. In this exemplary embodiment, the 3D printer 910 is a stereolithographic printer that uses light to cure a dielectric material that is in liquid resin form, layer by layer via photopolymerization. Such a printing procedure can be used to fabricate a body portion of the exemplary capacitive coupler 610 in accordance with the disclosure. In other implementations, other types of 3D printers can be used, such as a fused deposition modeling (FDM) printer that deposits material in layers that fuse together to form a 3D object. Because heat is used for fusing the multiple layers, the FDM printer may use various types of materials that are not photoreactive. Thus, for example, an electrically conductive material, such as a metal powder, can be utilized by an FDM printer to fabricate an electrode that is incorporated into a body portion of a capacitive coupler in accordance with the disclosure. As another example, a 3D printer that incorporates inkjet technology for dispensing an electrically conductive ink can be used to fabricate an electrode upon a body portion of a capacitive coupler in accordance with the disclosure.

In the arrangement shown in FIG. 9, the 3D printer 910 is communicatively coupled to one or more computers (as depicted by a computer 905) via a communication link 906 that can be implemented using various technologies (wired, wireless, optical, networked, etc.). The computer 905 executes a software program that is known in the industry as a slicing program, to control the operations of the 3D printer 910, which is a stereolithographic printer in this exemplary arrangement. The 3D printer 910 includes a light source 913, a lens system 912 for focusing light emitted by the light source 913, and a build platform 911. Depending on the type of the 3D printer 910, the light source 913 can be a laser projector or a digital light processing (DLP) image projector.

A procedure for fabricating the body portion of the capacitive coupler 610 is initiated by filling a tank (not shown) in the 3D printer 910 with a liquid photopolymer resin (the dielectric material). The build platform 911 is then lowered into the tank while the light source 913 is placed under control of the slicing program in a turned off state. The light source 913 is then turned on under control of the slicing program for executing a curing process that involves projecting an image (when the light source 913 is a DLP image projector) or tracing the image (when the light source 913 is a laser projector) upon the surface 916 of the capacitive coupler 610. At this time, the image projected by the DLP image projector or the image traced by the laser projector, defines a first layer of the capacitive coupler 610. The first layer of the capacitive coupler 610 is then produced as a result of the liquid photopolymer resin hardening in response to the projected image or traced image. After the liquid photopolymer resin has hardened to a desired level of hardness, the light source 913 is turned off and any residual liquid photopolymer resin is evacuated. The procedure is then repeated for subsequent layers, one layer at a time, until fabrication of the capacitive coupler 610 is completed. The build platform 911 moves upwards step by step for fabrication of each layer of the multiple layers.

Using a computer-controlled 3D printer and a liquid photopolymer offers several advantages over fabricating a capacitive coupler using traditional fabrication tools such as used in injection molding. For example, the capacitive coupler can be fabricated to conform to various form factors rapidly and flexibly. The design changes and/or fabrication procedure changes carried out upon the computer-controlled 3D printer can be geographically dispersed in nature, thereby allowing for example, a designer operating out of a remote facility to convey design changes to the computer-controlled 3D printer located at a manufacturing facility. The changes can be carried out dynamically and rapidly if so desired. In some exemplary implementations, a capacitive coupler can be fabricated in a stand-alone 3D printer having a built-in computer. The slicing program may be loaded into the stand-alone 3D printer in various ways such as by utilizing a memory device that is plugged into the stand-alone 3D printer, the memory device containing the slicing program.

Figure 10:
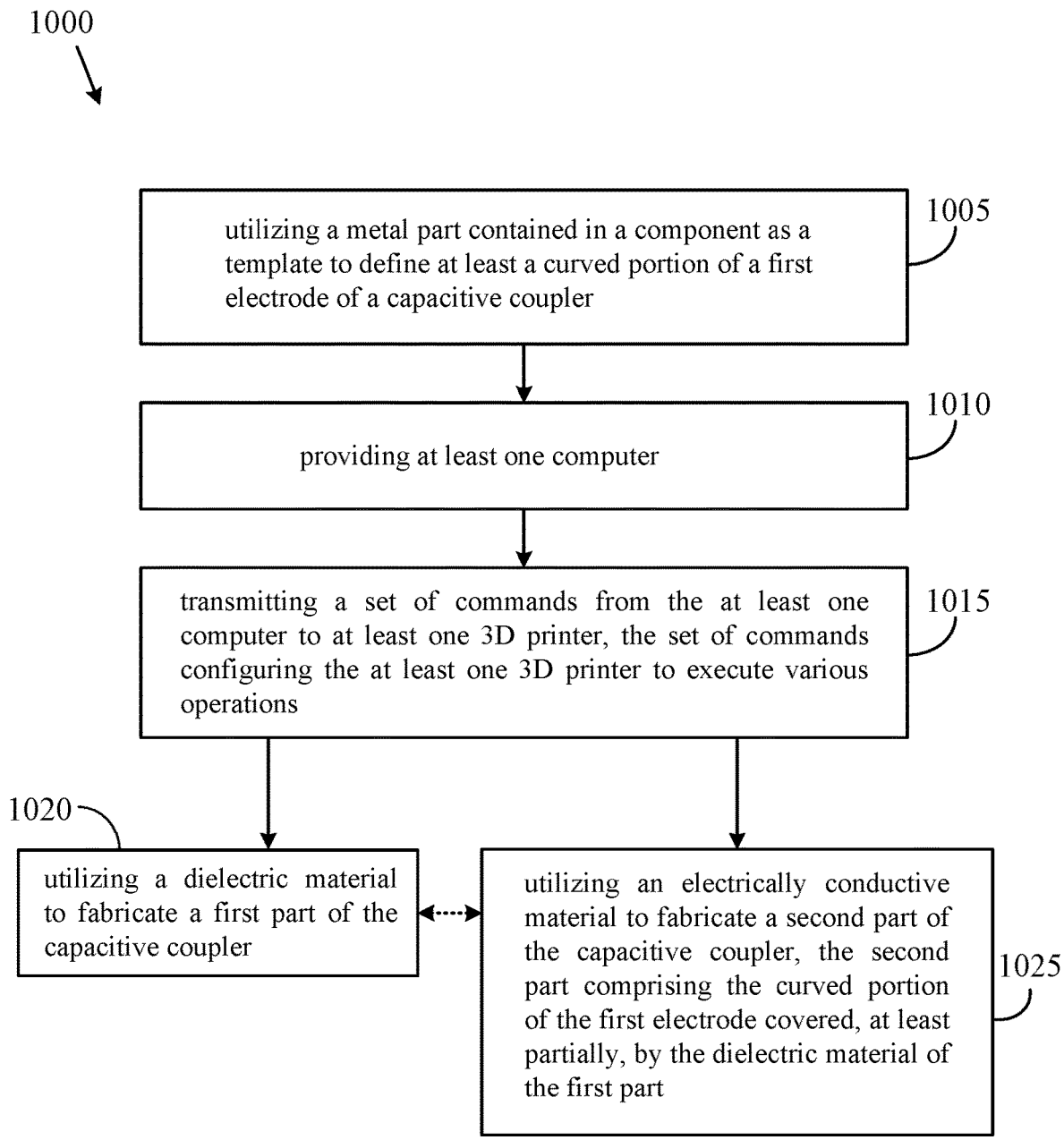
FIG. 10 shows a flowchart of a method of fabricating a capacitive coupler in accordance with an exemplary embodiment of the disclosure.

FIG. 10 shows a flowchart of a method 1000 of fabricating a capacitive coupler in accordance with an exemplary embodiment of the disclosure. Although particular example method steps are described herein, additional steps or alternative steps may be utilized in various implementations without detracting from the spirit of the invention. Moreover, steps may be executed out of order from that shown or discussed, including substantially concurrently or in reverse order, and/or one or more steps repeated, depending on various alternative implementations. Code for executing the various steps in a 3D printer for example, may be contained in one or more computers and may not be necessarily confined to any one computer or particular type of device. Furthermore, some of the steps of the flowchart have been described below using some exemplary elements described in the disclosure. It must be understood however, that the method steps can be applied to many other elements without detracting from the spirit of the invention.

In block 1005, a metal part contained in a component is utilized as a template to define at least a curved portion of a first electrode of a capacitive coupler. For example, the contact 507 contained in the RJ-45 connector 140 shown in FIG. 5 can be used as a template to define the electrode 506 in the capacitive coupler 505. Using such a template allows for the electrode 506 to incorporate a curved portion that is in close proximity to, and in parallel with, the contact 507 in the RJ-45 connector 140 when the capacitive coupler 505 is inserted into the RJ-45 connector 140. Defining the first electrode of the capacitive coupler by using the metal part as a template, can be carried out in various ways such as by executing a 3D scan of the metal part, utilizing a data sheet of the component, and/or utilizing a schematic of the component. As a part of this process, a form factor of at least a part of the first electrode is defined to substantially match a form factor of the metal part in the component.

For example, the electrode 506 in the capacitive coupler 505 is defined to include a first portion that matches a curved portion of the contact 507 contained in the RJ-45 connector 140 and a second portion that another shape such as a rod or a plate. The contact 507 contained in the RJ-45 connector 140, which is operative as a second electrode, may include a flat surface. Accordingly, the electrode 506 in the capacitive coupler 505 is defined to include a substantially similar flat surface thereby maximizing the level of capacitive coupling provided by the electrode 506 and the contact 507.

In block 1010, at least one computer is provided. An exemplary configuration is shown in FIG. 9 wherein the computer 905 is communicatively coupled to the 3D printer 910. Multiple computers, such as those provided in a computer network, may be communicatively coupled to the 3D printer 910 and/or to several other 3D printers. In another exemplary configuration, a computer is provided inside a stand-alone 3D printer. When multiple 3D printers are used, the various parts of the capacitive coupler can be fabricated in different 3D printers and the various parts assembled (manually in some exemplary implementations and/or by using assembling machines in other exemplary implementations) for producing a capacitive coupler in accordance with the disclosure.

In block 1015, a set of commands is transmitted from the computer to the 3D printer, such as from the computer 905 to the 3D printer 910. The set of commands can be a part of a slicing program executed by the computer 905 to configure the 3D printer 910 to execute various operations related to fabricating a capacitive coupler in accordance with the disclosure.

Block 1020 and block 1025 illustrate two among various operations that can be carried out by the 3D printer under control of the set of commands.

In an exemplary implementation of block 1020, a dielectric material is utilized to fabricate a first part of the capacitive coupler. One example of the first part is shown in FIG. 7 in the form the dielectric layer 712 that covers the electrode 711 and constitutes a body portion of the capacitive coupler 710 as well. In block 1025, an electrically conductive material is utilized to fabricate a second part of the capacitive coupler. One example of the second part is shown in FIG. 7 in the form of the electrode 711. A first portion of the electrode 711 (the portion that faces the metal part 706 in the component 705) is covered by the dielectric layer 712 and a second portion of the electrode 711 is embedded inside the body portion of the capacitive coupler 710. The second portion of the electrode 711 may include one or more terminals or leads that are used for connecting the capacitive coupler 710 to the AC signal source 310 (or to the measuring system 315).

In another exemplary implementation of block 1020, a dielectric material is utilized to fabricate a body portion of the capacitive coupler. In this exemplary implementation, the body portion includes an indentation having a shape that matches a curved portion of a metal part contained in a component under test. In block 1025, an electrically conductive ink is utilized to print the curved portion of the capacitive coupler. This is carried out by applying the electrically conductive ink to the indentation in the body portion. After the electrically conductive ink has dried, the method step of block 1020 is repeated so as to cover the electrically conductive ink with the dielectric material.

In yet another exemplary implementation of block 1020, a dielectric material is utilized to fabricate a body portion of the capacitive coupler. In this exemplary implementation, the body portion is fabricated layer by layer until a first set of layers constitutes the body portion. The method step of block 1025 is then executed by utilizing an electrically conductive material to fabricate a second part of the capacitive coupler that includes the curved portion. The second part is also fabricated layer by layer until a second set of layers is formed upon the first set of layers. The method step of block 1020 is then repeated so as to cover at least a portion of the second part with the dielectric material. Fabricating the capacitive coupler layer by layer in a 3D printer, enables fabricating intricate structures having various features such as projecting portions, indented portions, curved portions, and niches that provide a snug fit with various components that may be mounted upon a major surface of one of a platform or a printed circuit board.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A capacitive coupler insertable into a cavity defined by a component mounted upon a surface of a platform or a printed circuit board, the capacitive coupler comprising:
   a first part comprising a dielectric material; and
   a second part comprising an electrode having a first curved portion that is covered at least partially by the dielectric material of the first part, the first curved portion arranged to provide capacitive coupling through the dielectric material with a second curved portion of a metal part of the component mounted upon the surface of the platform or the printed circuit board when the capacitive coupler is inserted in the cavity.

2. The capacitive coupler of claim 1, wherein the second curved portion is substantially matched in shape to the first curved portion.

3. The capacitive coupler of claim 1, wherein the component is a connector mounted upon the one of the platform or the printed circuit board.

4. The capacitive coupler of claim 1, wherein the component is a plastic leaded chip carrier (PLCC) socket mounted upon the one of the platform or the printed circuit board, and wherein the first part of the capacitive coupler is a body portion that is configured to fit inside the cavity as defined by the PLCC socket.

5. A capacitive coupler comprising:
   a body portion insertable into a cavity of a component attachable to one of a platform or a printed circuit board, the component comprising a metal part positioned in the cavity;
   an electrode arranged on the body portion and having a first curved portion; and
   a dielectric layer formed over the first curved portion of the electrode such that, when the body portion is inserted into the cavity of the component, the dielectric layer is positioned between the first curved portion of the electrode and a second curved portion of the metal part positioned in the cavity of the component for providing capacitive coupling between the electrode and the metal part.

6. The capacitive coupler of claim 5, wherein the second curved portion is substantially matched in shape to the first curved portion.

7. The capacitive coupler of claim 5, wherein a form factor of the body portion matches a form factor of the cavity, causing the electrode to be aligned with the metal part positioned in the cavity.

8. The capacitive coupler of claim 5, wherein the metal part positioned in the cavity is oriented at a non-orthogonal angle with respect to a major surface of the one of the platform or the printed circuit board.

9. The capacitive coupler of claim 5, wherein the component is a plastic leaded chip carrier (PLCC) socket.

10. The capacitive coupler of claim 5, wherein the component further comprises a projecting portion, and wherein the body portion defines a cavity configured to accept the projecting portion of the component to align at least the first and second curved portions.

\* \* \* \* \*